(12) United States Patent (10) Patent No.: US 8,994,735 B1
Duplicy et al. (45) Date of Patent: Mar. 31, 2015

(54) RADIO SCENE EMULATOR

(75) Inventors: Jonathan Duplicy, Brussels (BE); Tandur Deepaknath, Leuven (BE)

(73) Assignee: Keysight Technologies, Inc., Santa Rosa, CA (US)

( * ) Notice: Subject to any disclaimer, the term of this patent is extended or adjusted under 35 U.S.C. 154(b) by 725 days.

(21) Appl. No.: 13/285,077

(22) Filed: Oct. 31, 2011

(51) Int. Cl.
G09G 5/22 (2006.01)
G09G 5/395 (2006.01)

(52) U.S. Cl.
CPC ................................. *G09G 5/395* (2013.01)
USPC .................................................... 345/440.1

(58) Field of Classification Search
USPC .................................................... 345/440.1
See application file for complete search history.

(56) References Cited

U.S. PATENT DOCUMENTS

2004/0095350 A1* 5/2004 Kamiyama .................. 345/441

OTHER PUBLICATIONS

Wellens et al. ("Empirical time and frequency domain models of spectrum use," Physical Communication, vol. 2, Issue 1, pp. 10-32, Mar. 2009, Elsevier B.V.*
Chittabrata Ghosh et al., "A Framework for Statistical Wireless Spectrum Occupancy Modeling," IEEE Transactions on Wireless Communications, vol. 9, No. 1, Jan. 2010, pp. 38-44.
Serhan Yarkan et al, "Binary Time Series Approach to Spectrum Prediction for Cognitive Radio," IEEE 66th Vehicular Technology Conference, Fall 2007, pp. 1563-1567, Oct. 2007.

* cited by examiner

*Primary Examiner* — Edward Martello

(57) ABSTRACT

A system for defining a radio scene to be emulated includes a display device configured to display a graphical user interface having a grid and at least one waveform block, representing at least a portion of a waveform, included in the grid in response to selection of a type of the waveform, at least one specification of the waveform, and a time pattern of the waveform. The grid has a frequency axis and a time axis, and the at least one waveform block extends along the time axis of the grid according to the time pattern of the waveform.

20 Claims, 8 Drawing Sheets

RADIO SCENE EMULATOR

BACKGROUND

Radio systems (e.g., wireless devices) are affected by a variety of factors, including the communication standards, frequencies, powers and waveforms of signals of the wireless devices, as well as signals of other wireless devices in the vicinity. Further, the number of different types of radios, such as IEEE 802.11 (WiFi), IEEE 802.16 (WiMAX), Bluetooth, Global System for Mobile Communication (GSM), High Speed Packet Access (HSPA), Long-Term Evolution (LTE) and the like, integrated into a single wireless device is generally increasing, resulting in co-existence problems. Therefore, in order to design communication devices, it is desirable to emulate radio scenes that accurately simulate such factors in a real world operating environment, in order to test viability of proposed schemes, as wells as robustness of waveforms against interferers.

Further, future cognitive radio systems may have to make use not only of databases, but also of radio frequency (RF) sensing engines to identify holes in the spectrum for signal transmission. To properly test such sensing engines, stimulus signals should mimic radio scenes that may be encountered, generally over a wide frequency band.

However, conventional radio scene emulators are static in nature and quite limited in scope and capability. For example, one conventional solution for testing LTE signals enables the user to combine LTE signals with only W-CDMA waveforms, which is not sufficient for in-depth testing.

In order to increase data rates, future to-be-deployed standards, such as LTE-Advanced, will introduce the so-called carrier aggregation feature, which stands for transmission of information over several (non) frequency adjacent carriers. The possibility of transmitting information using different types of waveforms (e.g., LTE and CDMA) over different bands is also being investigated. To properly test such future standards, complete radio scenes must be emulated, thus going beyond capabilities of conventional single-carrier, single-waveform devices.

SUMMARY

In a representative embodiment, a system for emulating defining a radio scene to be emulated includes a display device configured to display a graphical user interface including a grid and at least one waveform block, representing at least a portion of a waveform, included in the grid in response to selection of a type of the waveform, at least one specification of the waveform, and a time pattern of the waveform. The grid has a frequency axis and a time axis, and the at least one waveform block extends along the time axis of the grid according to the time pattern of the waveform.

Another representative embodiment provides a computer readable medium storing a program, executable by a computer, for defining a radio scene to be emulated. The computer readable medium includes waveform selection code for receiving a selected type of waveform to be emulated; waveform specification code for receiving at least one specification of the waveform; mode selection code for receiving selection of one of a deterministic mode and a model-based mode; and time pattern code for receiving a time pattern of the waveform according to the selected one of the deterministic mode and the model-based mode.

In another representative embodiment, a system for defining a radio scene to be emulated includes a display device and a processing device. The processing device is configured to execute programming operations, including receiving selection of a type of waveform via a graphical user interface (GUI), receiving at least one specification of the waveform via the GUI, and defining a time pattern of the waveform, the defined time pattern having at least one waveform block. The defined time pattern of the waveform is displayed by the display device in a grid, the gird having a frequency axis and a time axis. The at least one waveform block extends along the time axis of the grid according to the time pattern of the waveform.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element.

Likewise, if the device were rotated 90 degrees with respect to the view in the drawings, an element described as "vertical," for example, would now be "horizontal."

Various representative embodiments provide a simulation tool, including a graphical user interface (GUI), that enables a user to define extensively a radio scene along frequency and time axes of a grid. Using the GUI, the user is able to specify waveforms at desired frequencies or frequency bands along the frequency axis, as well as define on/off sequences along the time axis, enabling a full dynamic system. The user may also specify power profiles and channel fading characteristics. The waveforms may be standard compliant, and may overlap in the frequency domain. The simulation tool may include a library of waveforms, through which the user is able to access a large set of standard compliant waveforms to define the radio scene. The library may be provided by SignalStudio or SystemVue, available from Agilent Technologies, Inc., for example. The simulation tool may also enable the user to create user-defined waveforms.

In an embodiment, the simulation tool may also include a scene builder, which converts the defined waveforms of the emulated radio scene to an executable radio scene emulation file. The radio scene emulation file may then be played by a scene player, including hardware (e.g., signal generator) and/or software (e.g., SystemVue). The defined waveforms may contain power and channel fading information.

In an embodiment, multiple modes are offered to the user via the GUI. For example, a first mode may be a deterministic mode, in which the radio scene is defined primarily by the user. A second mode may be a model-based (stochastic) mode, in which the radio scene and, more particularly, the on/off sequences of the waveforms, are generated through stochastic process, such as a Markov chain, or a Poisson-based model, for example.

Figure 1A:
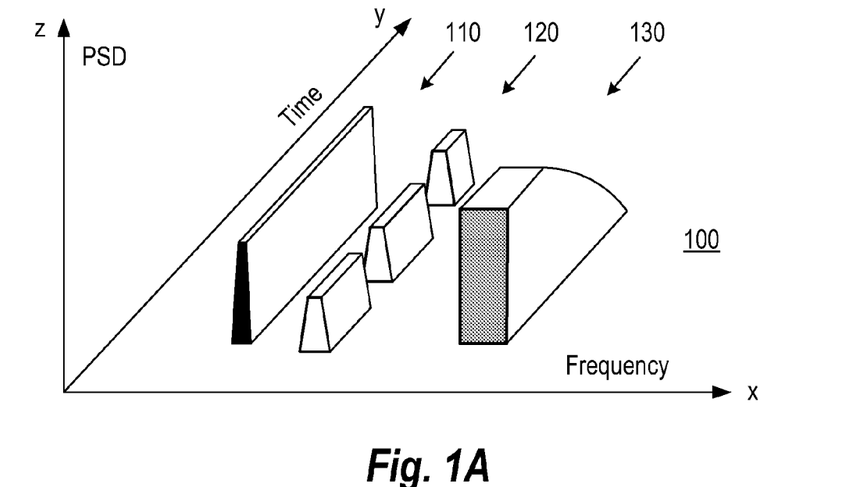
FIGS. 1A and 1B are graphs for conceptualizing a radio scene emulator, according to a representative embodiment.
Figure 1B:
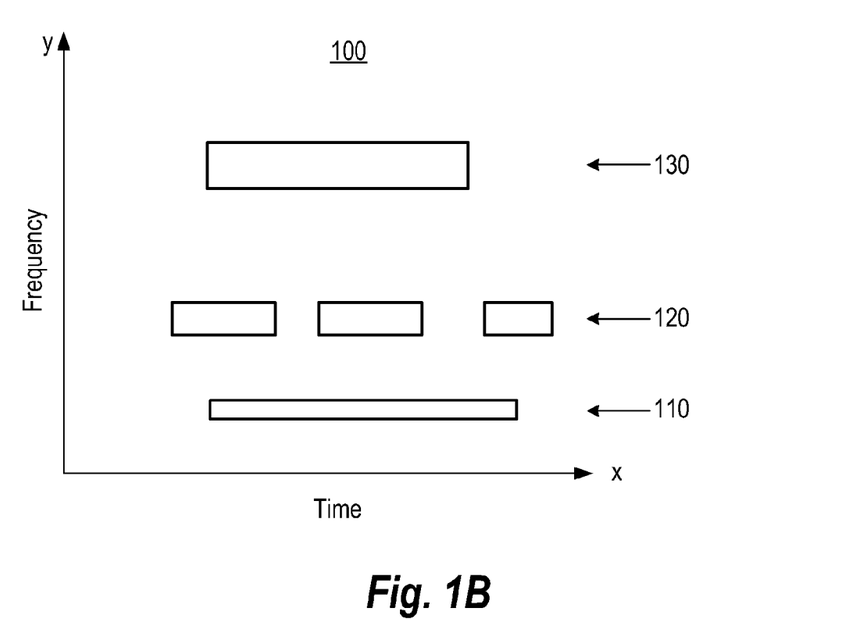

FIGS. 1A and 1B are graphs for conceptualizing a radio scene emulator, according to a representative embodiment.

FIG. 1A provides a three-dimensional view of illustrative radio scene 100 to be emulated. The x-axis displays time, the y-axis displays frequency, and the z-axis displays power spectral density (PSD). FIG. 1B provides a two-dimension view of the illustrative radio scene 100 in FIG. 1A along only the x-axis and the y-axis. The radio scene 100 includes waveforms from three different radio signals that may influence one another. The first waveform 110 occurs at the lowest frequency, has a relatively narrow bandwidth, and has a time pattern (on/off sequence) represented by a single waveform block, indicating one on-period within the depicted timeframe. The second waveform 120 occurs at a higher frequency than the first waveform 110, has a relatively wide bandwidth, and has a time pattern represented by multiple blocks separated by spaces, indicating multiple on-periods during the depicted timeframe. The third waveform 130 occurs at the highest frequency, has the largest bandwidth, and also has a time pattern represented by a single block. Each of the first through third waveforms 110-130 extend along the z-axis (as shown in FIG. 1A), which indicates the behavior of the individual waveforms with respect to the power spectral density. Of course, radio scene 100 is just one example among myriad possibilities, including any number and type of waveforms having various characteristics.

In the context of the representative embodiments discussed herein, the graph in FIG. 1B may be displayed via a GUI on a display device, such as display 637 in representative computer system 615, described below with reference to FIG. 6. The GUI enables the user to visualize the first through third waveforms 110-130 and how the spectrum responds in the emulated radio scene.

Figure 2:
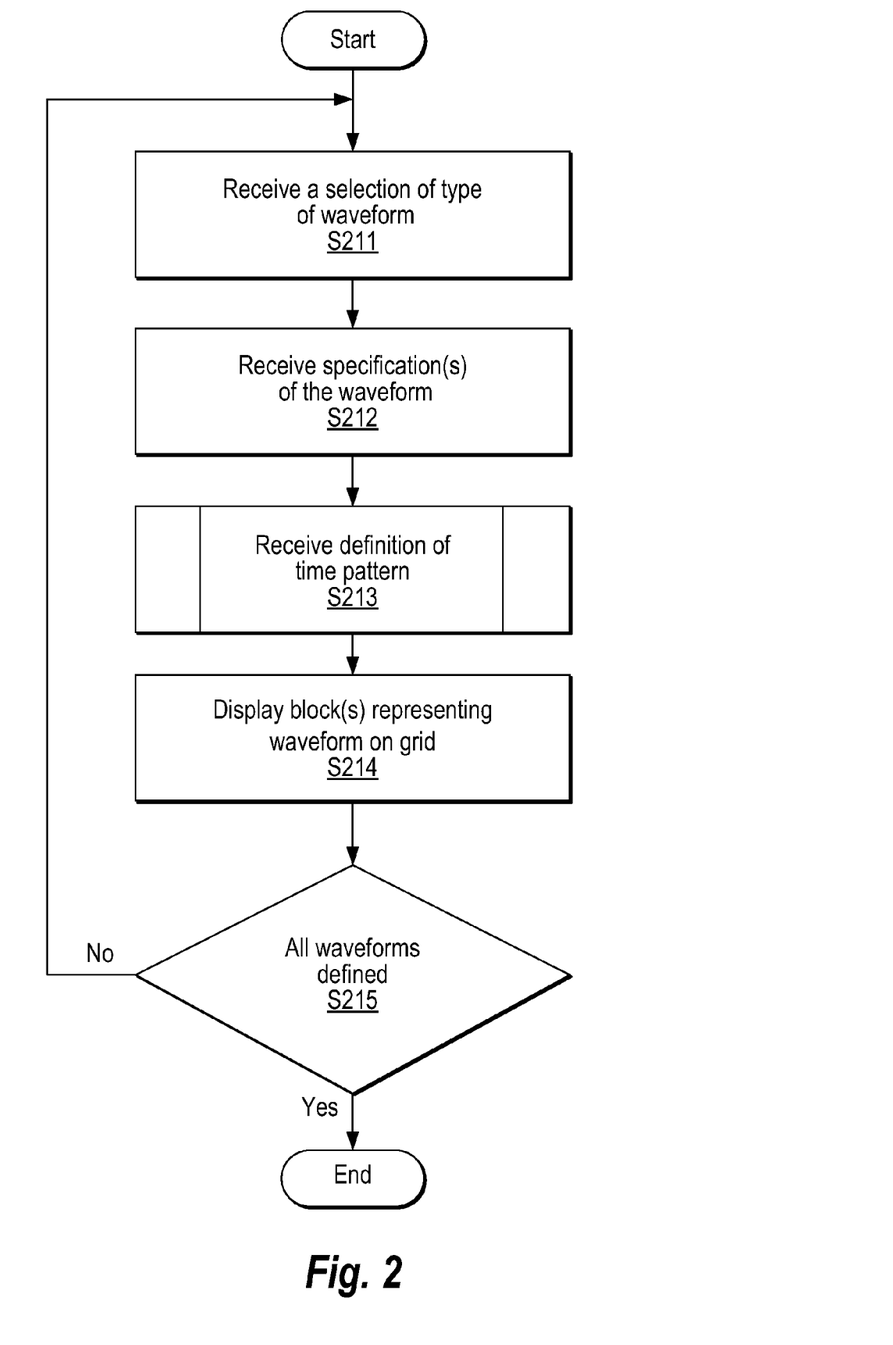
FIG. 2 is a flowchart illustrating a method of defining a radio scene to be emulated, according to a representative embodiment.
Figure 3:
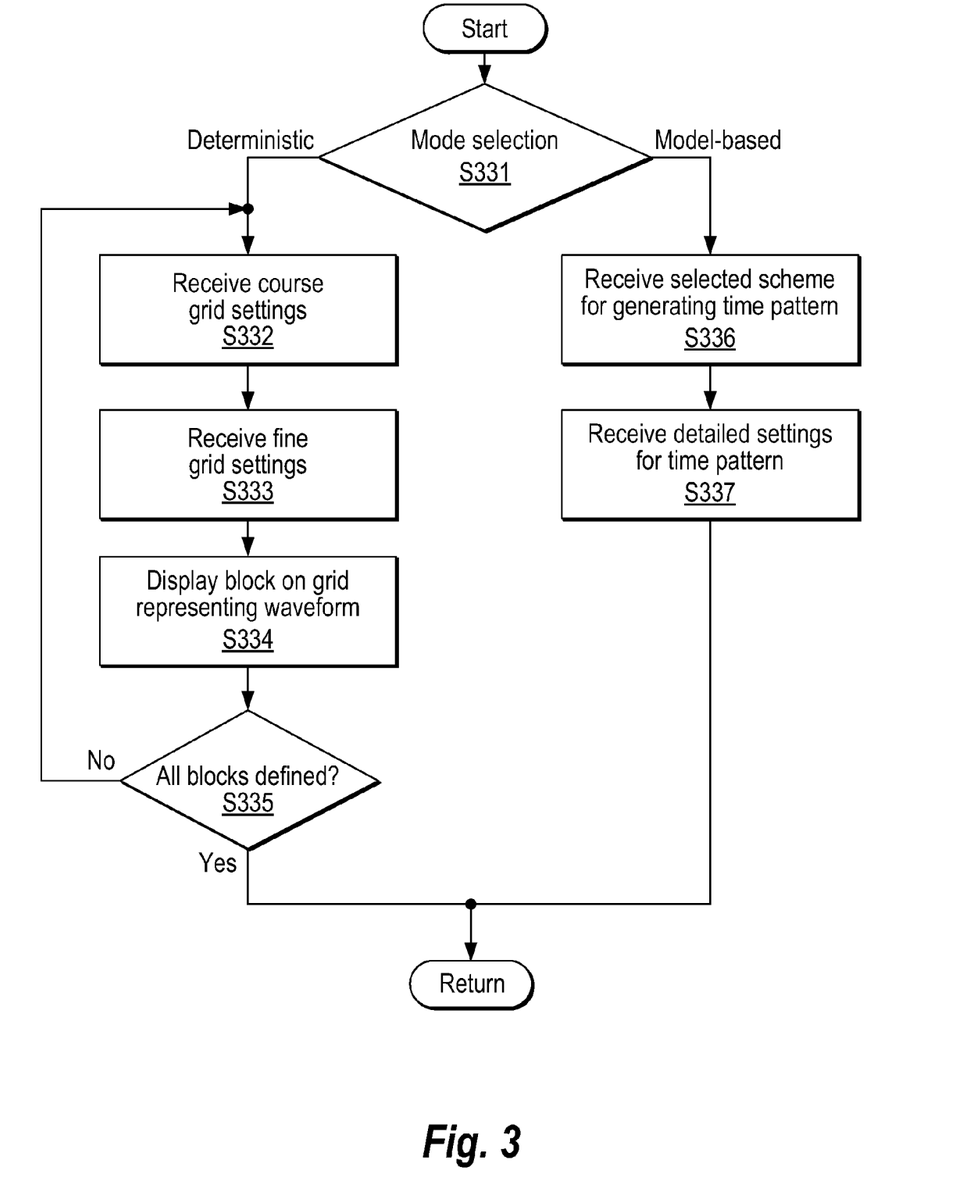
FIG. 3 is a flowchart illustrating a method of defining waveform time patterns for a radio scene in the method of FIG. 2, according to a representative embodiment.

FIG. 2 is a flowchart illustrating a method of defining a radio scene to be emulated, according to a representative embodiment, and FIG. 3 is a flowchart illustrating a method of receiving descriptions of waveform time patterns for defining a radio scene in the method of FIG. 2, according to a representative embodiment.

The various operations depicted in FIGS. 2 and 3 may be implemented in whole or in part by a processing device, such as processor 621 in representative computer system 615. In various alternative embodiments, the processing device may be implemented by a processor, application specific integrated circuits (ASICs), field-programmable gate arrays (FPGAs), or combinations thereof, using software, firmware, hard-wired logic circuits, or combinations thereof. When using a processor, a memory is included for storing executable software/firmware and/or executable code that allows it to perform the various functions. Operations requiring display to a user and/or input from the user may be implemented through a GUI under control of the processor. The display and input operation, including the GUI, may be implemented in whole or in part via display interface 627 and input/output (I/O) interface 626, for example, described below with reference to FIG. 6.

Referring to FIG. 2, a user selects the waveform of a signal to be emulated in the radio scene, and the selected waveform is received by the processor through the GUI in operation S211. Receiving the waveform may be accomplished in a number of ways. For example, the processor may cause a waveform selection menu to be displayed to a user through the GUI. The menu may include a prompt identifying the requested information (e.g., type of waveform) and a corresponding input field for receiving the user's response. The input field may be completed manually by the user, e.g., through operation of a keyboard or other input device. In an embodiment, the input field may include a drop-down menu or list providing specific, pre-determined choices from which the user make selections. The desired waveform may be a standard compliant waveform, such as WiFi, WiMAX, Bluetooth, GSM, HSPA, LTE, or the like. Alternatively, the waveform may be user defined, such as a narrow band interferer or a multi-tone waveform.

Figure 4A:
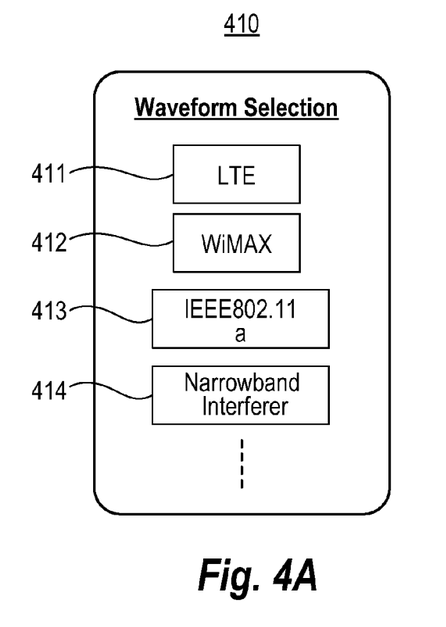
FIGS. 4A-4H show representative screen shots of a graphical user interface (GUI) for defining a radio scene in the method of FIG. 2, according to a representative embodiment.

FIG. 4A is a screenshot depicting representative GUI menu 410, which enables the user to select the waveform in operation S211. As shown, the GUI menu 410 provides a menu including icons for selecting at least four possible types of waveform: LTE icon 411, WiMAX icon 412, IEEE 802.11a icon 413 and Narrowband Interferer icon 414. The dots in the GUI menu 410 indicate additional types of waveform that may be displayed by scrolling down within the field. In an alternative embodiment, the GUI may simply provide an input field in which the user enters (e.g., types) the desired type of waveform.

In order to select the waveform, the user may simply click on one of the icons. When the Narrowband Interferer is selected, another menu is displayed requesting additional details regarding the user-defined waveform. For example, the user may provide the modulation, carrier frequency, bandwidth, time pattern, etc., of the waveform. Throughout the specification, the content and design of the GUI, including various grids and menus, may vary from the examples shown in FIGS. 4A-4H without departing from the scope of the present teachings.

Figure 4B:
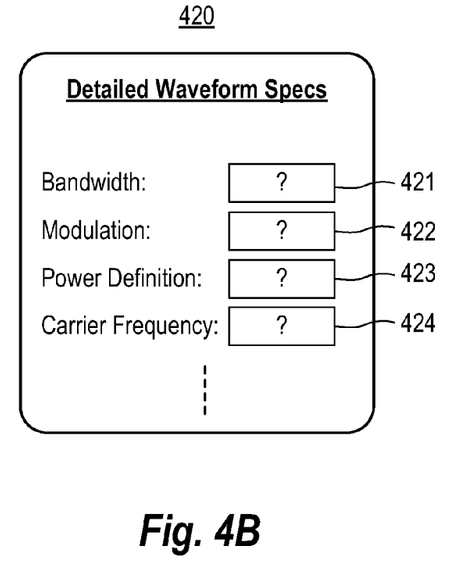

In operation S212, the processor receives detailed specifications related to the waveform. For example, the user may define the carrier frequency, bandwidth, modulation and power definition of the waveform. Receiving the waveform specifications may be accomplished in a number of ways. For example, FIG. 4B is a screenshot depicting representative GUI display 420 enabling the user to provide detailed specifications of the waveform, the type of which was selected in operation S212. As shown, the GUI display 420 provides at least four predetermined parameters and corresponding input fields required for emulating the signal. The input fields include Bandwidth field 421, Modulation field 422, Power Definition field 423 and Carrier Frequency field 424 for receiving the corresponding parameters. In an embodiment, the detailed specifications entered by the user are checked for consistency with the type of waveform selected in operation S211. For example, in the LTE case, the user may be limited to selecting a bandwidth from among the following options: 1.4 MHz, 3 MHz, 5 MHz, 10 MHz, 15 MHz and 20 MHz, which are the ones offered by the standard. Attempted selection of another bandwidth would result in a warning. The dots in the GUI menu 420 indicate additional parameters of waveform that may be displayed by scrolling down within the field.

In operation S213, the processor receives a definition of a time pattern of the waveform. The definition may be provided by the user or determined automatically by the processor, for example, depending on the manner in which the waveform is to be defined. In an embodiment, the definition of the waveform time pattern may be determined according to the process depicted in FIG. 3, for example.

More particularly, FIG. 3 is a flowchart illustrating a method of defining time patterns of waveforms for a radio scene in the method of FIG. 2, according to a representative embodiment. Referring to FIG. 3, a mode is selected in operation S331, enabling the user to select between a deterministic-based approach or "deterministic mode" (operations S332-S334) and a model-based approach or "model-based mode" (operations S335-S337). The deterministic mode enables the user to specify the time pattern of the waveform, including the on/off sequence (one or more sets of start and stop times). The model-based mode generates the waveform using a stochastic process. For example, the time pattern of the waveform in the model-based mode may be defined using one of a Markov chain approach, a Poisson process, or a user-defined random process, and a total simulation time period may be specified by the user.

Figure 4C:
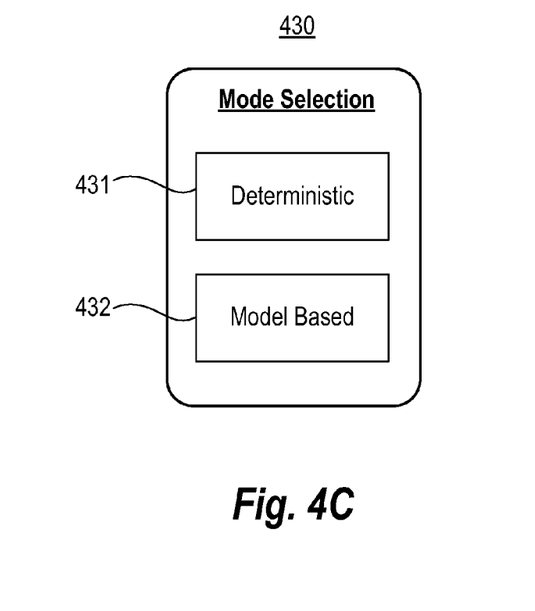

FIG. 4C is a screenshot depicting representative GUI menu 430 enabling the user to select one of the multiple modes for generating the waveform. As shown, the GUI menu 430 provides the two illustrative options for generating the waveform mentioned above, e.g., the deterministic mode and the model-based mode. The user selects the deterministic mode by clicking on the Deterministic icon 431 and selects the model-based mode by clicking on the Model-Based icon 432. Of course alternative and/or additional modes may be provided, without departing from the scope of the present teachings.

When the user selects the deterministic mode in operation S331, the processor enables the user to define the desired time pattern of the waveform by entering on and off times of the corresponding time sequence, to define one or more desired on-periods. For example, in the depicted embodiment, the processor displays a two-dimensional time-frequency grid on the display device, and receives course grid settings of the desired waveform through the GUI in operation 332. The course grid settings may be provided through manual interaction by the user. That is, the user is able to build one or more waveform blocks corresponding to the waveform directly on the grid in operation S332, e.g., by operation of a mouse or other input device.

Figure 4D:
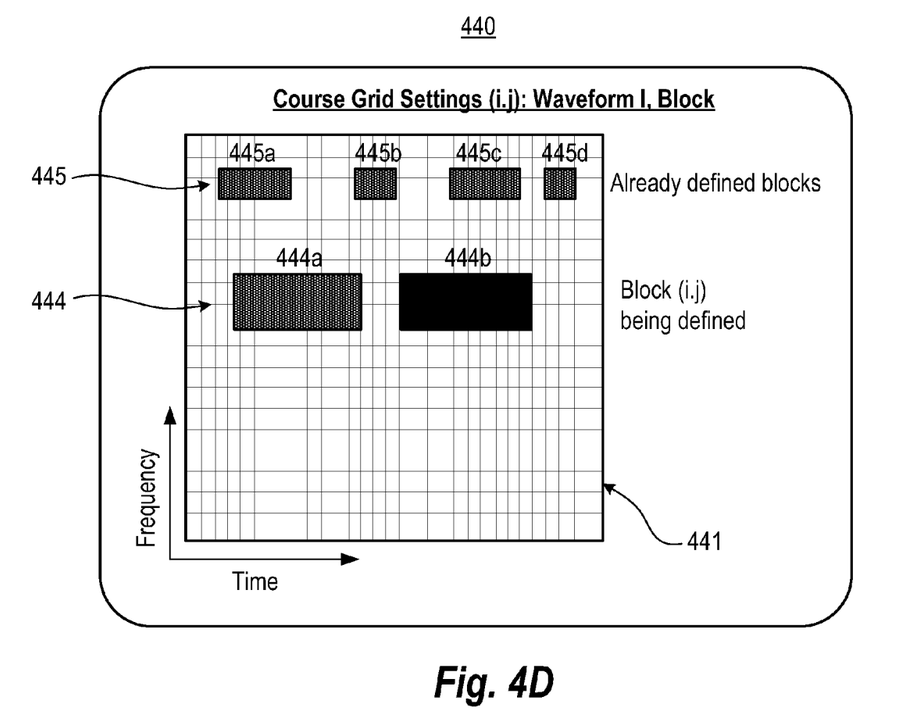

FIG. 4D is a screenshot depicting representative GUI display 440, which includes a time-frequency grid 441 enabling the user to build one or more coarse waveform blocks corresponding to the waveform. More particularly, the time-frequency grid 441 depicts representative waveform 444 which is being defined by the user. The waveform 444 is a time pattern that includes first and second waveform blocks 444a and 444b, indicating the on/off sequence of the waveform. In the depicted example, the time-frequency grid 441 also includes a previously defined time pattern 445, including first through fourth previously defined waveform blocks 445a-445d, so that the time pattern 444 currently being defined is displayed in the context of other waveforms in the emulated radio scene. Alternatively, the time-frequency grid 441 may include no previously defined time patterns or a multiplicity of previously defined patterns, without departing from the scope of the present teachings.

With respect to defining the time pattern 444, the user may place the curser on the time-frequency grid 441, e.g., using the mouse, and create a waveform block by clicking and holding down the right mouse button to indicate "on-time," dragging the cursor in the time direction along the x-axis, and releasing the mouse button to indicate "off-time" for each of the first and second waveform blocks 444a and 444b. The user is thus able to shorten or elongate the first and second waveform blocks 444a and 444b along the time axis of the time-frequency grid 441. The first and second waveform blocks 444a and 444b may have a previously defined frequency (e.g., corresponding to the carrier frequency and bandwidth entered in operation S212), and thus extends automatically in the frequency direction along the y-axis of the time-frequency grid 441. However, in various embodiments, the user may adjust the first and second waveform blocks 444a and 444b in the frequency direction using the cursor in substantially the same manner described above.

Figure 4E:
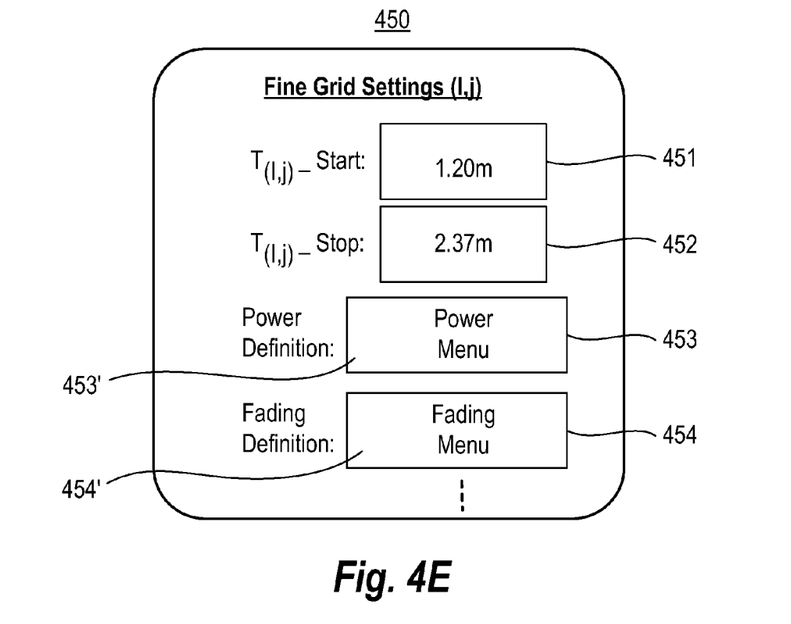

In operation S333, fine grid settings of the time pattern 444 are received through the GUI, e.g., in order to compensate for inaccuracies inherent in manual formation of the coarse first and second waveform blocks 444a and 444b. The fine grid settings may be received in response to information entered by the user into input fields displayed through the GUI. FIG. 4E is a screenshot depicting representative Fine Grid Setting display 450 for enabling the user to refine the one or more coarse waveform blocks of the waveform. The Fine Grid Setting display 450 includes multiple fields for enabling the user to more precisely define the time pattern. More particularly, in the depicted example, the Fine Grid Setting display 450 includes $T_{(i,j)\_}$Start field 451, $T_{(i,j)\_}$Stop field 452, Power Definition field 453 and Fading Definition field 454. The $T_{(i,j)\_}$Start field 451 and $T_{(i,j)\_}$Stop field 452 may sequentially correspond to the start time and the stop time of each of the first and second waveform blocks 444a and 444b of the time pattern 444, where i represents the time pattern (e.g., time pattern 444) and j represents the waveform block within the time pattern. For example, assuming the time pattern 444 corresponds to a second waveform of the emulated radio scene (time pattern 445 corresponding to a first waveform), the first waveform block 444a would be defined by $T_{(2,1)\_}$Start and $T_{(2,1)\_}$Stop and the time period of the second waveform block 444b would be defined by $T_{(2,2)\_}$Start and $T_{(2,2)\_}$Stop.

In the depicted example, 1.20 ms has been entered into the T_Start field 451 and 2.37 ms has been entered into the T_Stop field 452, which for purposes of discussion are assumed to correspond to the start and stop times of the waveform block 442. In an embodiment, the T_Start field 451 and the T_Stop field 452 are pre-filled with initial values derived from the start and stop times derived from the corresponding coarse waveform block built on the time-frequency grid 441 in operation S332 of FIG. 3, enabling the user simply to adjust the times as needed. The first waveform block 444a is automatically revised on the time-frequency grid 441 to reflect the fine grid settings relating to start and stop times when enter through the GUI.

As mentioned above, the Fine Grid Setting display 450 may further include (optional) Power Definition Field 453 and Fading Definition Field 454. The Power Definition field 453 enables the user to provide details on power and the Fading Definition field 454 enables the user to provide details on fading characteristics of the channel. For example, the Power Definition field 453 may enable the user to input the power profile of the signal source, which is the energy of the signal source, examples of which are shown extending along the z-axis for the first through third waveforms 110-130 in FIG. 1A. The power may be fixed for along the entire x-axis of the waveform, may be different among different waveform blocks, or even may have a "to-be-defined" profile as illustrated by the third waveform 130. The Fading Definition field 454 may enable the user to input fading characteristics of the channel between the signal source and a receiver in the communications device. The channel fading characteristics enable emulating the channel between the signal source and the receiver. For example, in a cellular communications network, the signal source may be a base station that outputs a certain power to the signal, which is then faded by the channel before reaching the antenna and receiver of the mobile communications device. The fading characteristics may include delays and power profiles, and Doppler effect, for example. In the depicted embodiment, the Power Definition field 453 includes Power Menu 453' and the Fading Definition field 454 includes Fading Menu 454'. In response to selection of the Power Menu 453' and the Fading Menu 454', one or more power and fading characteristic parameters may be displayed on the display device, respectively.

In an embodiment, the step of receiving coarse grid settings (operation S332) may be omitted, and the waveform may be defined entirely using numeric fields, such as the T_Start field 451 and the T_Stop field 452. Also, in an embodiment, the waveform may be defined without the use of a GUI.

In operation S334 of FIG. 3, the portion of the time pattern defined in operation S333 is displayed in the time-frequency grid, e.g., by updating the time-frequency grid 441. More particularly, the time-frequency grid 441 depicts representative first waveform block 444a of the time pattern 444, along with previously defined time pattern 445, as defined by the user. The user is asked in operation S335 if all of the waveform blocks of the time pattern have been defined. If additional waveform blocks need to be defined (operation S335: No), the process returns to operation S332 to receive the course grid settings of the next waveform block, followed by operation S333 to receive the fine grid settings of the next waveform block. For example, the user may define the first waveform block 444a of the time pattern 444 the first time through operations S332 to S334, and the second waveform block 444b of the time pattern 444 the second time through operations S332 to S334.

If there are no additional waveform blocks to be defined (operation S335:Yes), the process returns to FIG. 2 at operation S214, where the fully defined time pattern of the waveform is displayed, e.g., in the time-frequency grid 441. In operation S215, the user is asked if all waveforms of the emulated radio scene have been defined. When all of the waveforms have not yet been defined (S215: No), the process returns to operation S211 to receive selection of the next waveform. Operations S211-S215 are then repeated. When all of the waveforms have been defined (S215: Yes), the process depicted in FIG. 2 ends.

Figure 4F:
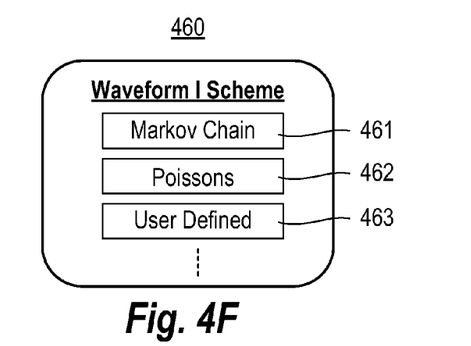

Referring again to operation S331 of FIG. 3, when the user selects the model-based mode (as opposed to the deterministic mode), the processor automatically generates the desired time pattern of the waveform in accordance with a stochastic model selected by the user. For example, in the depicted embodiment, the processor displays a waveform scheme menu on the display device, and receives a selected waveform generation scheme for generating a time pattern of the waveform from the user through the GUI in operation 335. FIG. 4F is a screenshot depicting representative Waveform Scheme menu 460 enabling the user to select the type of stochastic process to be used for generating the time pattern. The Waveform Scheme menu 460 includes Markov Chain icon 461, Poisson icon 462 and User Defined icon 463. Selection of the Markov Chain icon 461 (and provision of further details by the user, as would be apparent to one of ordinary skill in the art) causes the processor to automatically define the time pattern of the considered waveform according to a Markov Chain process. An example of defining waveform time patterns according to a Markov Chain process is provided by S. Yarkan et al., "Binary Time Series Approach to Spectrum Prediction for Cognitive Radio," Vehicular Technology Conference (September 2007), which is hereby incorporated by reference. Selection of the Poisson icon 462 (and provision of further details by the user, as would be apparent to one of ordinary skill in the art) causes the processor to automatically define the time pattern of the considered waveform using a Poisson process. An example of defining waveform time patterns according to a Poisson process is provided by C. Ghosh et al., "A Framework for Statistical Wireless Spectrum Occupancy Modeling," IEEE TRANSACTIONS ON WIRELESS COMMUNICATIONS, Vol. 9, No. 1 (January 2010), which is hereby incorporated by reference. Selection of the User Defined icon 463 enables the user to identify (and describe) another process for defining the waveform time pattern. The user defined waveform is particularly useful for defining various interfering signals.

Figure 4G:
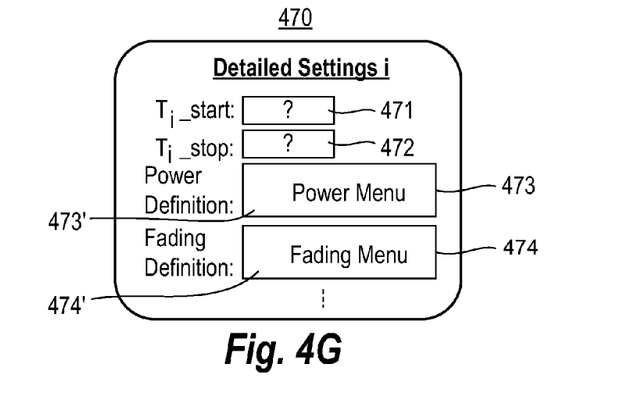

In operation S337, detailed settings corresponding to the time pattern are received through the GUI. The detailed settings include start and stop times for the entire simulation, and definition of power and channel fading characteristics. The detailed settings may be received in response to information entered by the user into input fields displayed through the GUI. For example, FIG. 4G is a screenshot depicting representative Detailed Setting display 470 for enabling the user to enter additional information regarding the length of the simulation and the time pattern. The Detailed Setting display 470 includes multiple fields. More particularly, in the depicted example, the Detailed Setting display 470 includes $T_i$_Start field 471, $T_i$_Stop field 472, Power Definition field 473 and Fading Definition field 474. The $T_i$_Start field 471 and $T_i$_Stop field 472 respectively indicate the start and stop times of the simulation, where i represents the time pattern (e.g., time pattern 484 in FIG. 4H, discussed below).

The (optional) Power Definition field 473 and the Fading Definition field 474, and enable the user to provide details on power and channel fading characteristics. In an embodiment, the Power Definition field 473 and the Fading Definition field 474, including corresponding Power Menu 473' and Fading Menu 474', respectively, are substantially the same as the Power Definition field 453 and the Fading Definition field 454, and corresponding Power Menu 453' and Fading Menu 454' discussed above with reference to FIG. 4E, and therefore the discussion will not be repeated.

Figure 4H:
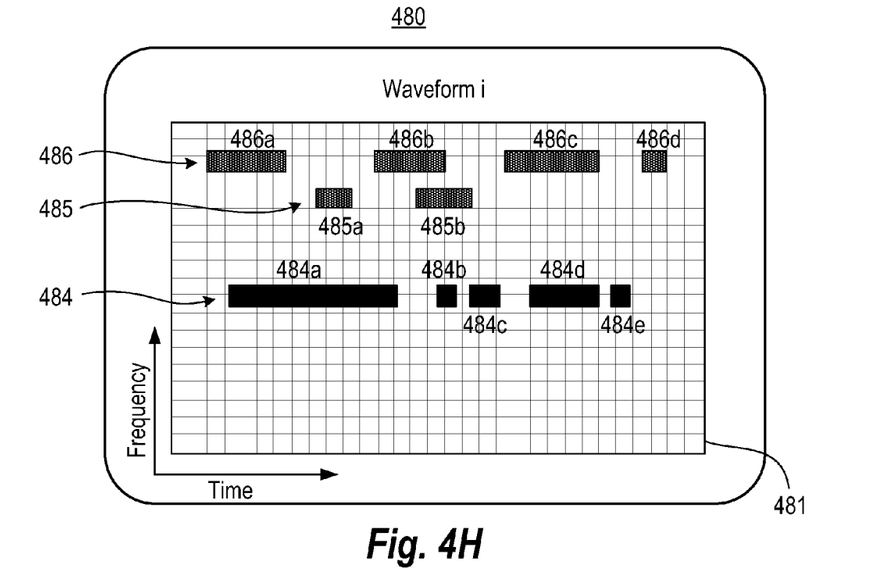

In the depicted embodiment, the stochastic process provides the entire time pattern of the waveform in response to the information received in blocks S336 and S337, so the process returns to FIG. 2 at operation S214, where the fully defined time pattern of the waveform is displayed, e.g., in time-frequency grid 481. FIG. 4H is a screenshot depicting representative GUI display 480, which includes the time-frequency grid 481 displaying one or more time patterns of waveforms and corresponding waveform blocks. More particularly, the time-frequency grid 481 depicts representative time pattern 484 which is currently defined according to the waveform scheme selected by the user. The time pattern 484 includes first through fifth waveform blocks 484a-484e, for example.

In the depicted example, the time-frequency grid 481 also includes previously defined time pattern 485, including first and second previously defined waveform blocks 485a and 485b, and previously defined time pattern 486, including first through fourth previously defined waveform blocks 486a-486d, so that the time pattern 484 being defined is displayed in the context of other time patterns of waveforms in the emulated radio scene. Notably, the previously defined time patterns 485 and 486 may have been defined using any mode, including the deterministic mode or the model-based mode. In this context, the time-frequency grid 441 and the time-frequency grid 481 may be effectively inter-changeable, in that both time-frequency grids may display the previously defined time pattern initially depicted using the other time-frequency grid. Alternatively, the time-frequency grid 481 may include no previously defined time patterns or a multiplicity of previously defined patterns, without departing form the scope of the present teachings.

The channel fading characteristics are not necessarily shown on the time-frequency grid 441, 481. In alternative embodiments, the time-frequency grid 441, 481 may be modified to include channel fading information, such as depicting waveform blocks with dashed lines when the corresponding waveform is channel faded.

After defining and displaying the time pattern (e.g., time pattern 484) on the GUI, the user is asked if all waveforms of the emulated radio scene have been defined in operation S215. When all of the waveforms have not yet been defined (S215: No), the process returns to operation S211 to receive selection of the next waveform. Operations S211-S215 are then repeated. When all of the waveforms have been defined (S215: Yes), the process depicted in FIG. 2 ends. The GUI displays the time-frequency grid 441, 481, which depicts all of the defined waveforms, whether they were built using the deterministic mode or the model-based mode.

In various embodiments, the user is able to edit the emulated radio scene after it has been defined (e.g., according to the operations of FIGS. 2 and 3) via the GUI. For example, the user may be able to change the carrier frequency of an interferer in order to evaluate the impact of the interferer at various frequency locations. Also, in various embodiments, the user is able to specify all or a portion of the emulated radio scene to be played, as discussed below, and to selectively loop back the emulated radio scene.

FIGS. 2-4H are directed to the process of defining waveforms in a radio scene to be emulated. Once the waveforms have been defined, they may be provided to a scene builder for building the emulated radio scene and a scene player to execute or play the built emulated radio scene.

The scene builder may be implemented by software, for example, executable by the computer system 615 discussed below with reference to FIG. 6. The scene builder effectively translates the defined radio scene into an executable file (e.g., referred to as ARB). For example, the scene builder may retrieve the defined waveforms (and/or waveforms from a waveform library, e.g., provided by SignalStudio or SystemVue) that compose the emulated radio scene. For each waveform, the builder adjusts power, applies the corresponding time pattern, and applies channel fading characteristics (if needed). The builder then resamples the waveform to a common sampling rate, and applies frequency offset. The builder adds the waveforms to create the emulated radio scene, which may be stored as a file, for example, in the memory 622.

The scene player is configured to play the file containing the emulated radio scene built by the scene builder. The scene player may be implemented by software (e.g. SystemVue), executable by the computer system 615, or hardware, such as signal generator 635, discussed below with reference to FIG. 6, for example. Using the scene player, the user is able to play, replay, modify and navigate through the scene, without changing the stored emulated radio scene file.

For example, a scene player GUI may display the emulated radio scene as it is played by the scene player. In addition, the GUI may display an input field for the user to enter a specific time at which the emulated radio scene is played. The GUI may alternatively provide control buttons, such as stop, play, pause, forward and reverse, which the user may select to move to different times in the emulated radio scene. Similarly, the GUI may enable the user to graphically interact with the emulated radio scene by manually sliding a timing bar along the time axis (x-axis) to indicate a desired time at which to observe the emulated radio scene.

Figure 5A:
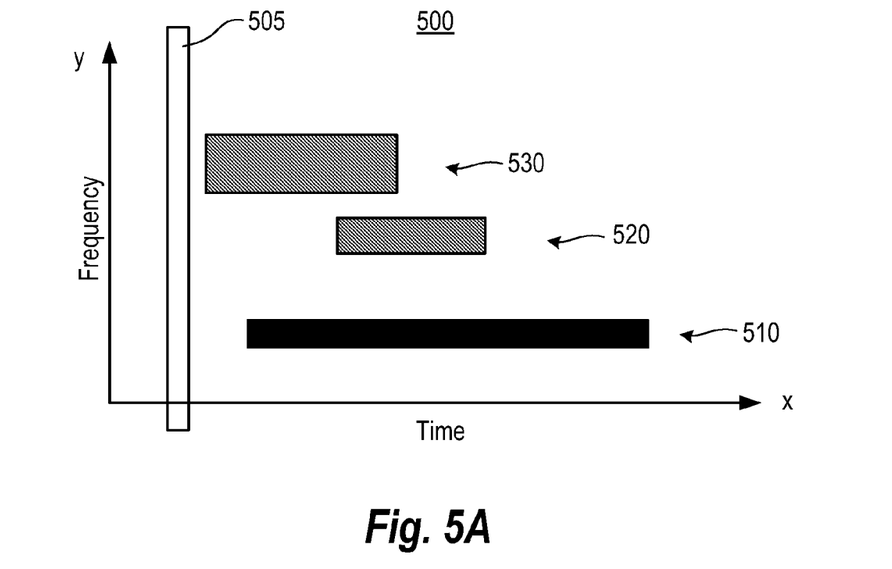
FIG. 5A is a representative screen shot of a GUI indicating location in an emulated radio scene, according to a representative embodiment.
Figure 5B:
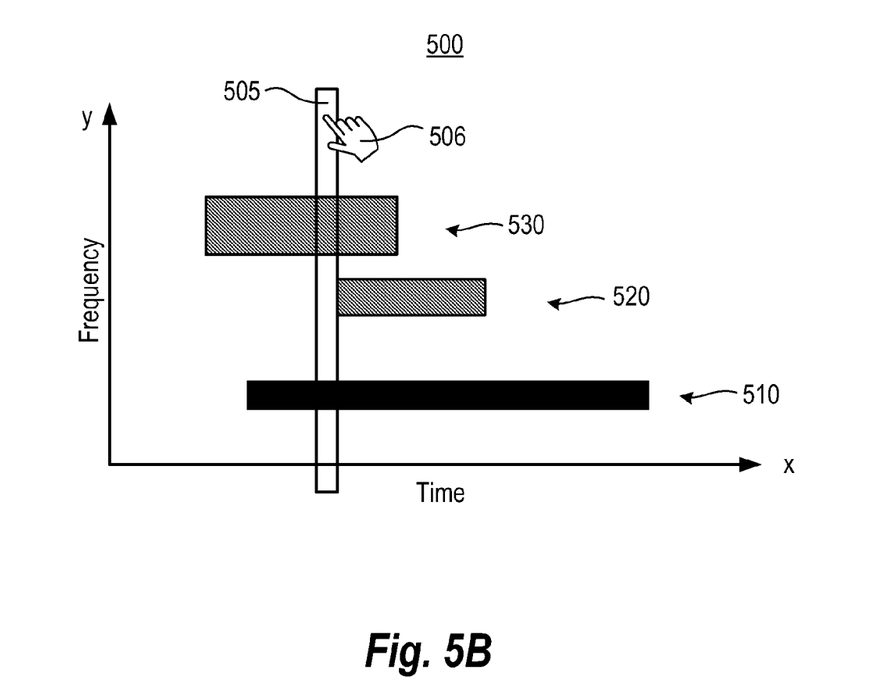
FIG. 5B is a representative screen shot of a GUI enabling navigation through an emulated radio scene, according to a representative embodiment.

FIG. 5A is a representative screen shot of a GUI indicating location within an emulated radio scene being played, according to a representative embodiment. FIG. 5B is a representative screen shot of a GUI enabling navigation through an emulated radio scene being played, using graphic interaction, according to a representative embodiment.

FIGS. 5A and 5B shows emulated radio scene 500 including waveforms from three different radio signals that may influence one another. First waveform 510 occurs at the lowest frequency, second waveform 520 occurs at a middle frequency, and third waveform 530 occurs at the highest frequency. For purposes of simplifying explanation, each of the first through third waveforms 510-530 are shown as time patterns having single waveform blocks, respectively, extending along the time axis (x-axis). Timing bar 505 extends along the frequency axis (y-axis), perpendicular to the first through third waveforms 510-530.

Referring to FIG. 5A, the timing bar 505 passively indicates the time along the time axis at which the emulation is currently playing. The timing bar 505 thus moves from left to right along the time axis as the radio scene emulation progresses.

Referring to FIG. 5B, the user is able to control movement of the timing bar 505, which is slidable along the time axis by clicking anywhere on the timing bar (indicated by the hand-shaped pointer 506) using a mouse or other input device and moving the timing bar left and right through the emulated radio scene 500 (e.g., while holding down the mouse button). The location to which the timing bar 505 is moved along the time axis actively dictates the time at which the actual emulation starts. For example, the position of the timing bar 505 shown in FIG. 5B indicates a time at which only the first waveform 510 and the third waveform 530 are in an on-period. The second waveform 520 thus effectively has no influence on the emulated radio scene 500 at that particular, selected time. The timing bar 505 moves from left to right along the time axis as the radio scene emulation progresses from the starting location.

Figure 6:
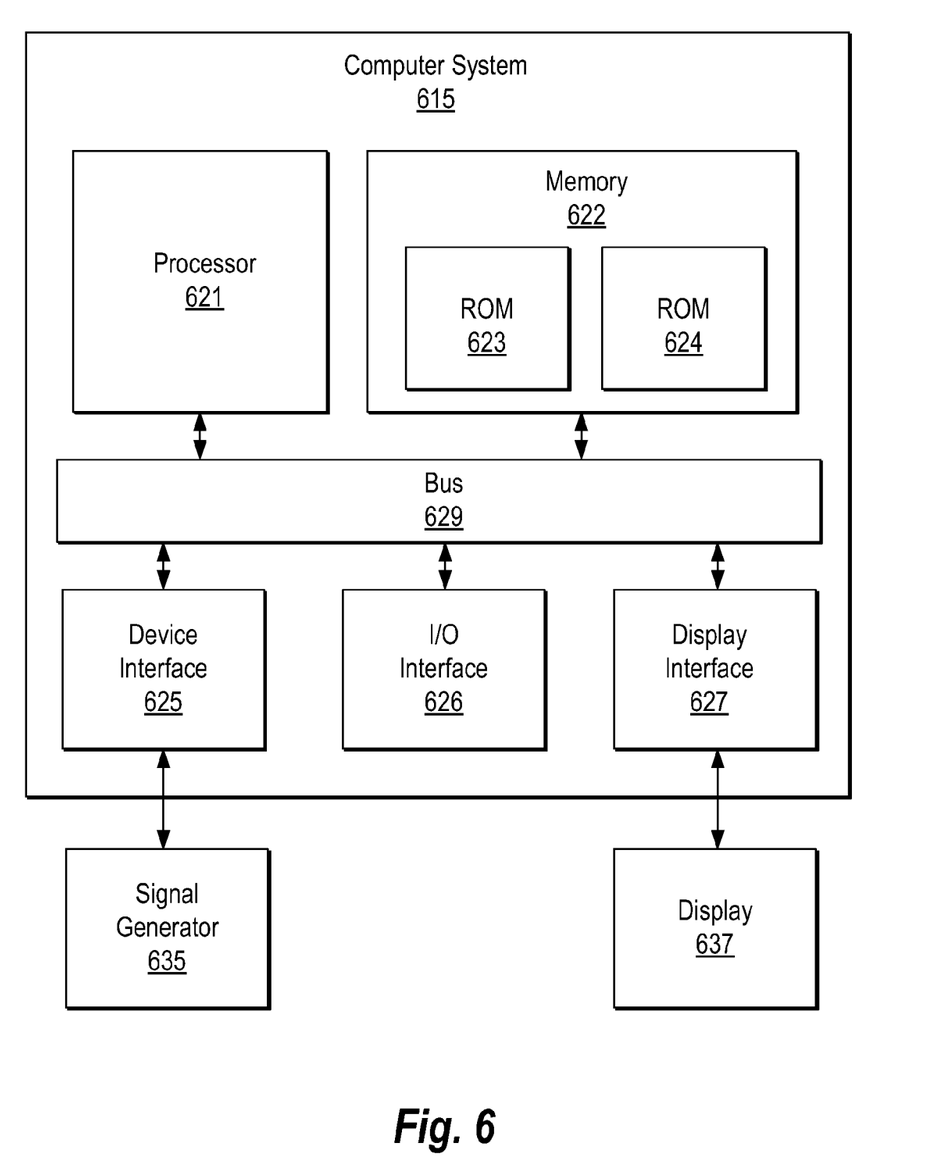
FIG. 6 is a functional block diagram showing an illustrative computer system for implementing emulation of a radio scene, according to a representative embodiment.

FIG. 6 is a functional block diagram showing an illustrative computer system 615 that executes all or a portion of a process for implementing emulation of a radio scene, according to a representative embodiment. The various "parts" shown in the computer system 615 may be physically implemented using a software-controlled microprocessor, e.g., processor 621, hard-wired logic circuits, firmware, or a combination thereof. Also, while the parts are functionally segregated in the computer system 615 for explanation purposes, they may be combined variously in any physical implementation.

In the depicted embodiment, the computer system 615 includes processor 621, memory 622, bus 629 and various interfaces 625-627. The processor 621 is configured to execute one or more logical or mathematical algorithms, including the emulated radio scene definition process of the embodiments described herein (e.g., including the various operations of FIGS. 2 and 3), as well as scene building and/or scene playing processes, in conjunction with the memory 622. The processor 621 may be constructed of any combination of hardware, firmware or software architectures, and include its own memory (e.g., nonvolatile memory) for storing executable software/firmware executable code that allows it to perform the various functions. Alternatively, the executable code may be stored in designated memory locations within memory 622, discussed below. In an embodiment, the processor 621 may be a central processing unit (CPU), for example, executing an operating system, which may also control execution of other programs of the computer system 615.

The memory 622 may be any number, type and combination of nonvolatile read only memory (ROM) 623 and volatile random access memory (RAM) 624, and stores various types of information, such as computer programs and software algorithms executable by the processor 621 (and/or other components), e.g., to perform location determination processes of the embodiments described herein. As generally indicated by ROM 623 and RAM 624, the memory 622 may include any number, type and combination of tangible computer readable storage media, such as disk drive, an electrically programmable read-only memory (EPROM), an electrically erasable and programmable read only memory (EEPROM), a CD, a DVD, a universal serial bus (USB) drive, and the like. Further, the memory 622 may store the predetermined boundaries one or more enterprise networks, as discussed above.

In an embodiment, a user (and/or other computers) may interact with the computer system 615 using various input device(s) through I/O interface 626. The input devices may include a keyboard, key pad, a track ball, a mouse, a touch pad or touch-sensitive display, and the like. Also, various information may be displayed on a display 637 through display interface 627, which may include the GUI of the embodiments described herein. Further, the processor 621 may interface with and otherwise control various external devices, such as representative signal generator 635, through device interface 625, and communicated to the processor 621 and/or the memory 622 via bus 629. The signal generator 635 may be capable of generating signals including the waveforms defined and displayed through the GUI on the display 637, according to the embodiments described herein. The signal generator 635 may be N5106A PXB signal generator, available from Agilent Technologies, Inc., for example.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A system for defining a radio scene to be emulated, comprising:
    a display device configured to display a graphical user interface comprising a grid and at least one waveform block, representing at least a portion of a waveform, included in the grid in response to selection of a type of the waveform, at least one specification of the waveform, and a time pattern of the waveform in the radio scene to be emulated,
    wherein the grid has a frequency axis and a time axis, and the at least one waveform block extends along the time axis of the grid according to the time pattern of the waveform.

2. The system of claim 1, wherein the time pattern comprises at least one set of start and stop times of the time pattern, the at least one waveform block starting at the start time and ending at the stop time along the time axis of the grid.

3. The system of claim 1, wherein the at least one specification of the waveform comprises at least one of bandwidth, modulation, power profile and carrier frequency.

4. The system of claim 1, further comprising:
    a scene builder configured to convert the waveform of the emulated radio scene to an executable radio scene emulation file; and
    a scene player configured to play the executable radio scene emulation file.

5. The system of claim 1, wherein the time pattern of the waveform is defined by a user in a deterministic mode.

6. The system of claim 5, wherein the graphical user interface enables the user to graphically define the time pattern in the grid by manually extending the at least one waveform block along the time axis.

7. The system of claim 1, wherein the time pattern of the waveform is defined according to a stochastic process in a model-based mode.

8. The system of claim 7, wherein the graphical user interface enables the user to select the stochastic process.

9. The system of claim 1, wherein the graphical user interface enables the user to input channel fading characteristics of the waveform.

10. The system of claim 4, wherein the graphical user interface further comprises a timing bar slidable along the time axis to indicate a desired time at which to play the radio scene.

11. A non-transitory computer readable medium storing a program, executable by a computer, for defining a radio scene to be emulated, the computer readable medium comprising:
    waveform selection code for receiving a selected type of waveform in the radio scene to be emulated;
    waveform specification code for receiving at least one specification of the waveform;
    mode selection code for receiving selection of one of a deterministic mode and a model-based mode; and
    time pattern code for receiving a time pattern of the waveform according to the selected one of the deterministic mode and the model-based mode.

12. The computer readable medium of claim 11, further comprising:
    display code for causing at least one waveform block representing at least a portion of the waveform to be displayed in a grid on a display device, the grid having a frequency axis and a time axis, and the at least one waveform block extending along the time axis of the grid according to the time pattern of the waveform, wherein the waveform block indicates a desired on-period of the time pattern at a previously defined frequency location on the frequency axis of the grid.

13. The computer readable medium of claim 12, wherein in the deterministic mode, the time pattern code comprises:

coarse grid setting code for enabling the user to shorten or elongate the at least one waveform block along the time axis of the grid; and fine grid setting code for enabling the user to refine timing values for the at least one waveform block using at least one input field.

14. The computer readable medium of claim 12, wherein the display code further causes a previously defined waveform block corresponding to a previously defined waveform to be displayed in the grid along with the at least one waveform block on the display device.

15. The computer readable medium of claim 11, wherein the selected type of the waveform is one of standard compliant waveform or a user defined waveform.

16. The computer readable medium of claim 15, wherein the user defined waveform comprises one of a narrow band interferer or a multi-tone waveform.

17. The computer readable medium of claim 12, wherein in the model-based mode, the time pattern code comprises:

modeling code for receiving selection of a model;

simulation time period code for receiving a start time and a stop time of a simulation time period; and channel fading characteristics code for receiving specified channel fading characteristics of the waveform.

18. A system for defining a radio scene for emulation, the system comprising:

a display device; and a processing device configured to execute programming operations comprising:

receiving selection of a type of waveform of the radio scene to be emulated via a graphical user interface (GUI);

receiving at least one specification of the waveform via the GUI; and defining a time pattern of the waveform, the defined time pattern comprising at least one waveform block, wherein the defined time pattern of the waveform is displayed by the display device in a grid, the gird having a frequency axis and a time axis, the at least one waveform block extending along the time axis of the grid according to the time pattern of the waveform.

19. The system of claim 18, wherein the time pattern of the waveform is set by a user in a deterministic mode, and defining the time pattern of the waveform comprises:

receiving course grid settings entered on the gird;

receiving fine grid settings entered into input fields corresponding to the at least one set of start and stop times of the waveform; and defining the time pattern based on at least the fine grid settings.

20. The system of claim 18, wherein the received time pattern of the waveform is set by a stochastic process in a model-based mode, and defining the time pattern of the waveform comprises:

receiving a selected model;

receiving start and stop times entered into input fields corresponding to a simulation time period; and defining the time pattern based on the selected modeling approach and the simulation time period.

* * * * *